(12) United States Patent
Yamaguchi et al.

(10) Patent No.: US 7,877,870 B2
(45) Date of Patent: Feb. 1, 2011

(54) METHOD OF BONDING TERMINAL

(75) Inventors: Hideki Yamaguchi, Kawasaki (JP);
Kouichi Tokairin, Kawasaki (JP);
Hirofumi Suzuki, Kawasaki (JP);
Hiroaki Kobayashi, Kawasaki (JP);
Hiroshi Minami, Kawasaki (JP)

(73) Assignee: Toshiba Storage Device Corporation, Tokyo (JP)

( * ) Notice: Subject to any disclaimer, the term of this patent is extended or adjusted under 35 U.S.C. 154(b) by 1161 days.

(21) Appl. No.: 11/521,811

(22) Filed: Sep. 15, 2006

(65) Prior Publication Data
US 2007/0269021 A1 Nov. 22, 2007

(30) Foreign Application Priority Data
May 19, 2006 (JP) .............................. 2006-139832

(51) Int. Cl.
*H01R 9/00* (2006.01)
*H05K 3/00* (2006.01)
(52) U.S. Cl. .............................. 29/843; 29/830; 174/254
(58) Field of Classification Search .................... 29/843, 29/842, 844, 845, 830; 174/254; 361/749–751
See application file for complete search history.

(56) References Cited
U.S. PATENT DOCUMENTS
4,795,079 A * 1/1989 Yamada ................... 228/179.1

FOREIGN PATENT DOCUMENTS
| JP | 63-307796 | 12/1988 |
| JP | 8-1323 | 1/1996 |
| JP | 2002-344128 | 11/2002 |

* cited by examiner

*Primary Examiner*—Jeremy C Norris
(74) *Attorney, Agent, or Firm*—Greer, Burns & Crain, Ltd.

(57) ABSTRACT

The tip end of the bonding tip is defined between first and second edges. A first inclined surface gets remoter from a first terminal at a position remoter from the first edge. The second inclined surface likewise gets remoter from the first terminal at a position remoter from the second edge. The solder is contoured by first and second contours on the first terminal. The second terminal is located on the solder between the first and second contours. The tip end of the bonding tip is urged against the second terminal. Heat is transferred from the bonding tip to the solder. The melted solder spreads into gaps between the second terminal and the first and second inclined surfaces. The solder is thus prevented from spreading outside the contour of the first terminal. This results in a reliable avoidance of a short circuit between the adjacent first terminals.

4 Claims, 9 Drawing Sheets

METHOD OF BONDING TERMINAL

BACKGROUND OF THE INVENTION

1. Field of the Invention

The present invention relates to a method of bonding a second terminal to a first terminal, comprising urging a second terminal against a solder located on a first terminal.

2. Description of the Prior Art

A carriage is incorporated in a hard disk drive, HDD. A first flexible printed circuit board is fixed to the side surface of the carriage. A flying head slider is fixed to the tip end of the carriage. A second flexible printed circuit board is utilized to connect the flying head slider to the first flexible printed circuit board. A sensing current and a writing current are supplied to the flying head slider from the first flexible printed circuit board through the second flexible printed circuit board.

First terminals are arranged on the first flexible printed circuit board. An opening is defined in the second flexible printed circuit board. Second terminals are arranged in the opening. The individual second terminal forms a so-called flying lead. Solder is utilized to bond the second terminals to the corresponding first terminals. The second flexible printed circuit board is in this manner coupled to the first flexible printed circuit board.

A bonding tip is utilized to bond the second terminals to the corresponding first terminals. The individual second terminal is positioned on the solder covering over the entire surface of the corresponding first terminal. The solder is contoured by first and second contours extending in parallel with each other. The second terminal is located in a space between the first and second contours. Heat is applied to the bonding tip. The flat tip end of the bonding tip is urged against the second terminal. The solder is thus melted. The flat tip end of the bonding tip is received on the entire surface of the first terminal. The solder spreads outside the first terminal along the surface of the first flexible printed circuit board. A contact is often established between the pieces of the solder on the adjacent first terminals. This causes a short circuit between the first terminals.

SUMMARY OF THE INVENTION

It is accordingly an object of the present invention to provide a method of bonding a terminal to a terminal, capable of preventing solder from excessively spreading.

According to a first aspect of the present invention, there is provided a method of bonding a second terminal to a first terminal, comprising using a tip end of a bonding tip for urging a second terminal onto a solder located on a first terminal, the solder contoured by first and second contours at least partially extending in parallel with each other, the second terminal at least partially located in a space between the first and second contours, wherein the tip end of the bonding tip is defined between a first inclined surface and a second inclined surface, the first inclined surface getting remoter from the first terminal at a position remoter from a first edge, the second inclined surface getting remoter from the first terminal at a position remoter from a second edge extending in parallel with the first edge, the first and second edges intersecting with the first and second contours.

The tip end of the bonding tip is defined between the first and second edges. The first inclined surface gets remoter from the first terminal at a position remoter from the first edge. The second inclined surface likewise gets remoter from the first terminal at a position remoter from the second edge. The solder is located on the first terminal. The solder is contoured by the first and second contours. The second terminal is located on the solder in a space between the first and second contours. When the tip end of the bonding tip is urged against the second terminal, heat is transferred from the tip end of the bonding tip to the solder through the second terminal. The solder is thus melted. The solder spreads into gaps between the second terminal and the first and second inclined surfaces. The solder is thus prevented from spreading outside the contour of the first terminal. This results in a reliable avoidance of a short circuit between the adjacent first terminals.

The bonding tip may allow a first imaginary plane including the first inclined surface to intersect with a second imaginary plane including the second inclined surface at an obtuse angle. The obtuse angle serves to enable establishment of a larger volume around the tip end of the bonding tip as compared with the case where the intersecting angle is set at an acute angle between the first and second imaginary planes. Heat is conducted to the tip end with a higher efficiency in the bonding tip. The heat can be transferred from the tip end of the bonding tip to the second terminal with a higher efficiency. This results in a reduction in the working time of bonding.

The first and second edges of the bonding tip may intersect with two or more pairs of the first and second contours. The bonding tip of the type allows a simultaneous bonding of two or more pairs of the first and second terminals. This results in a reduction in the working time of bonding.

According to a second aspect of the present invention, there is provided a method of bonding a terminal, comprising using a tip end of a bonding tip for urging a terminal onto a solder, the solder contoured by first and second contours at least partially extending in parallel with each other, the terminal at least partially located in a space between the first and second contours, wherein the bonding tip is tapered to the tip end extending on an imaginary straight line intersecting with the first and second contours.

The tip end of the bonding tip is designed to extend straight along the imaginary straight line intersecting with the first and second contours. The solder is contoured by the first and second contours. When the tip end of the bonding tip is urged against the second terminal in a space between the first and second contours, heat is transferred from the tip end to the second terminal. The heat is transferred from the second terminal to the solder. The solder is thus melted. Since the bonding tip tapers toward its straight tip end, the solder spreads into gaps between the bonding tip and the second terminal. The solder is thus prevented from spreading outside a first terminal receiving the solder. This results in a reliable avoidance of a short circuit between the adjacent first terminals.

In this case, the first and second edges of the bonding tip may intersect with two or more pairs of the first and second contours in the aforementioned manner. The bonding tip of the type allows a simultaneous bonding of two or more pairs of the first and second terminals. This results in a reduction in the working time of bonding.

The method serves to provide a specific joint assembly. The joint assembly comprises: a first terminal located on a first printed wiring board; a solder located on the first terminal, the solder contoured by first and second contours at least partially extending in parallel with each other; a second terminal located on a second printed wiring board, the second terminal overlaid on the solder in a space between the first and second contours; and a notch formed in the solder between the first and second contours, the notch extending along an imaginary straight line intersecting with the first and second contours.

The joint assembly allows the second terminal to bend at a fold extending in parallel with the imaginary straight line so as to correspond to a shape of the notch. The joint assembly may further comprise an opening defined in the second printed wiring board. The second terminal may be located in the opening. The second terminal may establish a so-called flying lead.

A specific bonding tip may be provided to realize the aforementioned method of bonding. The bonding tip may comprise: a first inclined surface defined along a first imaginary plane including a first edge; a second inclined surface defined along a second imaginary plane including a second edge extending in parallel with the first edge; and a tip end defined between the first and second edges, wherein the first imaginary plane intersects with the second imaginary plane at an obtuse angle. In this case, the first imaginary plane may intersect with the second imaginary plane at an obtuse angle.

According to a third aspect of the present invention, there is provided a method of making a storage device, preparing a first flexible printed wiring board attached to a carriage having a tip end supporting a head suspension, the first flexible printed wiring board including a first terminal; preparing a second flexible printed wiring board extending from the head suspension toward the carriage, the second flexible printed wiring board including a second terminal; and using a tip end of a bonding tip for urging the first terminal onto a solder located on the second terminal, the solder contoured by first and second contours at least partially extending in parallel with each other, the first terminal at least partially located in a space between the first and second contours, wherein the tip end of the bonding tip is defined between a first inclined surface and a second inclined surface, the first inclined surface getting remoter from the second terminal at a position remoter from a first edge, the second inclined surface getting remoter from the second terminal at a position remoter from a second edge extending in parallel with the first edge, the first and second edges intersecting with the first and second contours.

In this case, a first imaginary plane including the first inclined surface may intersect with a second imaginary plane including the second inclined surface at an obtuse angle in the same manner as described above. The first and second edges of the bonding tip may intersect with two or more pairs of the first and second contours. The second terminal may establish a flying lead.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
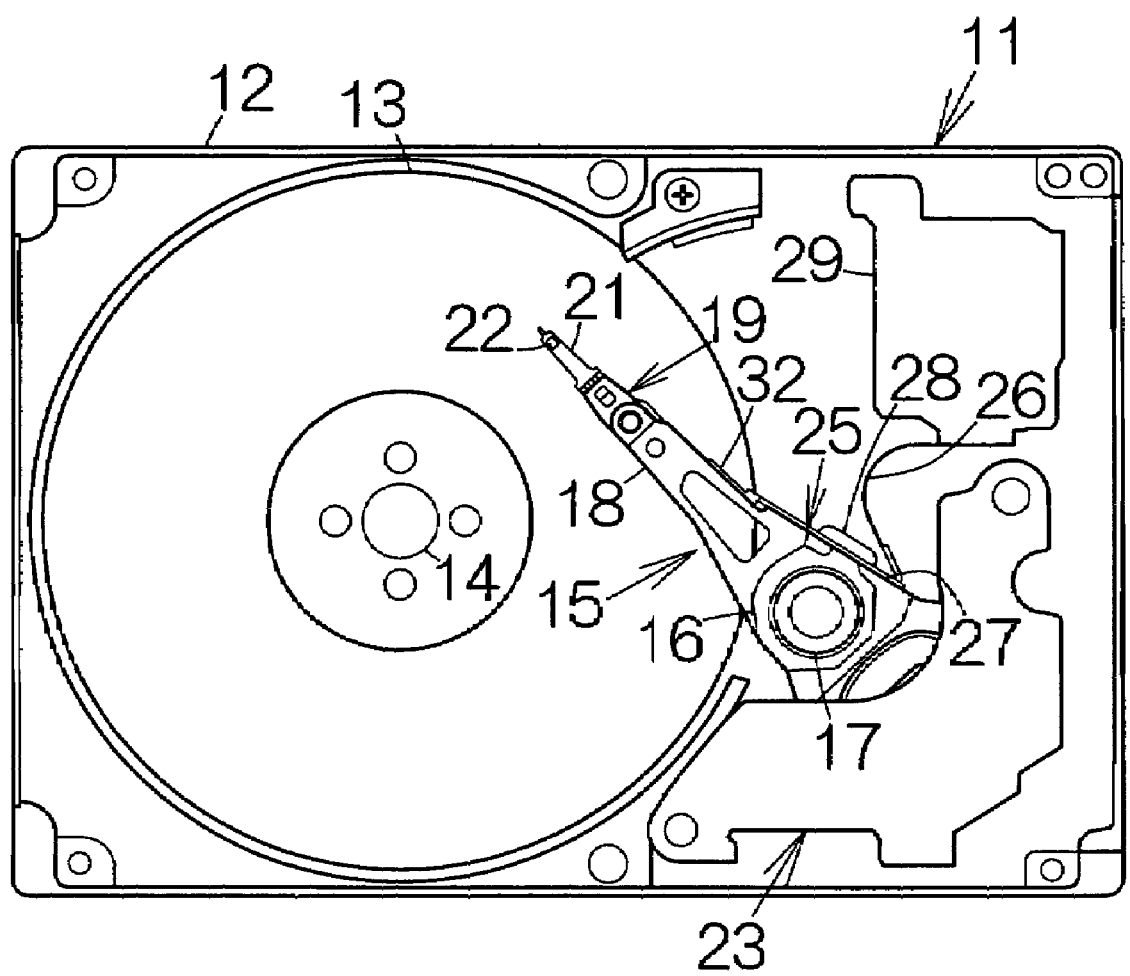
FIG. 1 is a plan view schematically illustrating the inner structure of a hard disk drive (HDD) as an example of a recording medium drive according to an embodiment of the present invention.

FIG. 1 schematically illustrates the inner structure of a hard disk drive, HDD, 11 as an example of a recording medium drive or storage device according to the present invention. The hard disk drive 11 includes a box-shaped enclosure body 12 defining an inner space of a flat parallelepiped, for example. The enclosure body 12 may be made of a metallic material such as aluminum, for example. Molding process may be employed to form the enclosure body 12. An enclosure cover, not shown, is coupled to the enclosure body 12. The enclosure cover closes the opening of the enclosure body 12. Pressing process may be employed to form the enclosure cover out of a plate material, for example.

At least one magnetic recording disk 13 as a recording medium is enclosed in the enclosure body 12. The magnetic recording disk or disks 13 are mounted on the driving shaft of a spindle motor 14. The spindle motor 14 drives the magnetic recording disk or disks 13 at a higher revolution speed such as 5,400 rpm, 7,200 rpm, 10,000 rpm, 15,000 rmp, or the like.

A head actuator member, namely a carriage 15, is also enclosed in the enclosure body 12. The carriage 15 includes a carriage block 16. The carriage block 16 is supported on a vertical support shaft 17 for relative rotation. Carriage arms 18 are defined in the carriage block 16. The carriage arms 18 are designed to extend in a horizontal direction from the vertical support shaft 17. The carriage block 16 may be made of aluminum, for example. Extrusion process may be employed to form the carriage block 16, for example.

A head suspension assembly 19 is attached to the front or tip end of the individual carriage arm 18. The head suspension assembly 19 is designed to extend forward from the carriage arm 18. The head suspension assembly 19 includes a head suspension 21. The head suspension 21 is designed to extend forward from the tip end of the carriage arm 18. A predetermined urging force is applied to the front or tip end of the head suspension 21 toward the surface of the corresponding magnetic recording disk 13. A flying head slider 22 is fixed to the tip end of the head suspension 21.

An electromagnetic transducer, not shown, is mounted on the flying head slider 22. The electromagnetic transducer includes a write element and a read element. The write element may include a thin film magnetic head designed to write magnetic bit data onto the magnetic recording disk 13 by utilizing a magnetic field induced at a thin film coil pattern.

The read element may include a giant magnetoresistive (GMR) element or a tunnel-junction magnetoresistive (TMR) element designed to discriminate magnetic bit data on the magnetic recording disk 13 by utilizing variation in the electric resistance of a spin valve film or a tunnel-junction film, for example. Here, a heater, not shown, is incorporated in the flying head slider 22 at a position adjacent to the electromagnetic transducer. As conventionally known, the heater generates heat for controlling the flying height of the flying head slider 22.

When the magnetic recording disk 13 rotates, the flying head slider 22 is allowed to receive an airflow generated along the rotating magnetic recording disk 13. The airflow serves to generate a positive pressure or a lift as well as a negative pressure on the flying head slider 22. The flying head slider 22 is thus allowed to keep flying above the surface of the magnetic recording disk 13 during the rotation of the magnetic recording disk 13 at a higher stability established by the balance between the urging force of the head suspension 21 and the combination of the lift and the negative pressure.

A power source or voice coil motor, VCM, 23 is coupled to the carriage block 16. The voice coil motor 23 serves to drive the carriage block 16 around the vertical support shaft 17. The rotation of the carriage block 16 allows the carriage arms 18 and the head suspension assemblies 19 to swing. When the carriage arm 18 swings around the vertical support shaft 17 during the flight of the flying head slider 22, the flying head slider 22 is allowed to move along the radial direction of the magnetic recording disk 13. The electromagnetic transducer on the flying head slider 22 can thus be positioned right above a target recording track on the magnetic recording disk 13.

A flexible printed circuit board unit 25 is located on the carriage block 16. The flexible printed circuit board unit 25 includes a first flexible printed wiring board 26. An adhesive may be utilized to attach the first flexible printed wiring board 26 to the surface of a metal plate 27 such as an aluminum plate, for example. A screw may be utilized to fix the metal plate 27 to the carriage block 16, for example.

The first flexible printed wiring board 26 includes a sheet metal such as an aluminum plate. An insulating layer, an electrically-conductive layer and a protecting layer are overlaid on the sheet metal in this sequence. The electrically-conductive layer includes a wiring pattern, not shown, extending on the first flexible printed wiring board 26. The electrically-conductive layer may be made of an electrically-conductive material such as copper, for example. The insulating layer and the protecting layer may be made of a resin material such as a polyimide resin, for example.

A head IC (integrated circuit) or preamplifier IC 28 is mounted on the first flexible printed wiring board 26. The preamplifier IC 28 is designed to supply the read element with a sensing current when the magnetic bit data is to be read. The preamplifier IC 28 is also designed to supply the write element with a writing current when the magnetic bit data is to be written. Likewise, the preamplifier IC 28 is designed to supply the heater with a controlling current for the heater. A small-sized circuit board 29 is located within the inner space of the enclosure body 12. The small-sized circuit board 29 is designed to supply the preamplifier IC 28 with the sensing current, the writing current and the controlling current.

A second flexible printed wiring board 32 is utilized to supply the sensing current, the writing current and the controlling current. The second flexible printed wiring board 32 is related to the individual head suspension assembly 19. The second flexible printed wiring board 32 includes a sheet metal such as a stainless steel plate. An insulating layer, an electrically-conductive layer and a protecting layer are overlaid on the sheet metal in this sequence. The electrically-conductive layer includes a wiring pattern, not shown, extending on the second flexible printed wiring board 32. The electrically-conductive layer may be made of an electrically-conductive material such as copper, for example. The insulating layer and the protecting layer may be made of a resin material such as a polyimide resin, for example.

Figure 2:
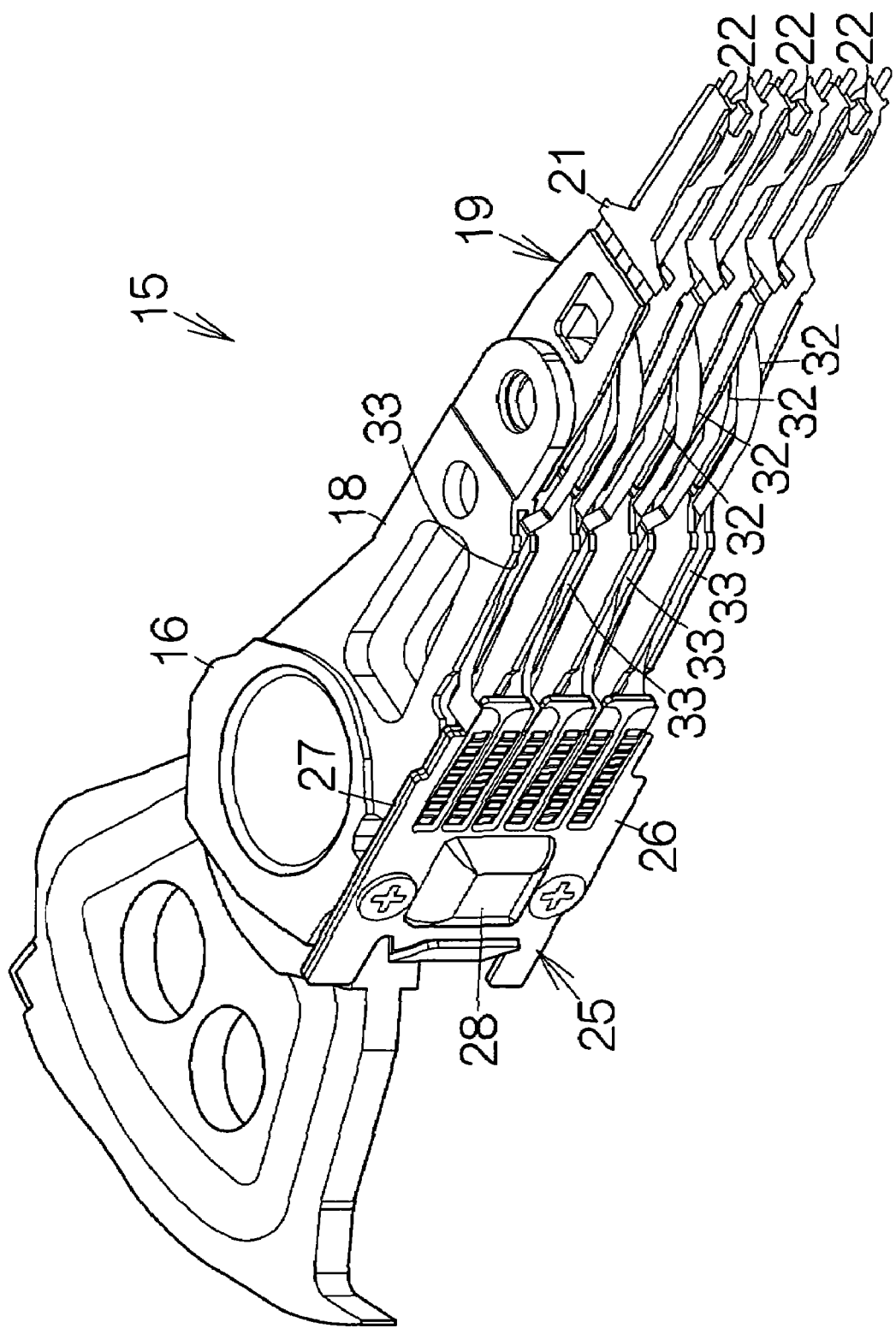
FIG. 2 is a perspective view schematically illustrating the structure of a carriage.

As shown in FIG. 2, one end or the front end of the second flexible printed wiring board 32 is fixed to the head suspension 21. The wiring pattern on the second flexible printed wiring board 32 is connected to the flying head slider 22. Spot welding may be employed to fix the second flexible printed wiring board 32 to the head suspension 21, for example. The second flexible printed wiring board 32 is designed to extend backward from the head suspension 21 along the side surface of the carriage arm 18. The head suspension assembly 19 has the structure of a so-called long-tail. The carriage arm 18 includes a groove 33. The second flexible printed wiring board 32 is received in the groove 33. The groove 33 is defined in the side surface of the carriage arm 18.

Figure 3:
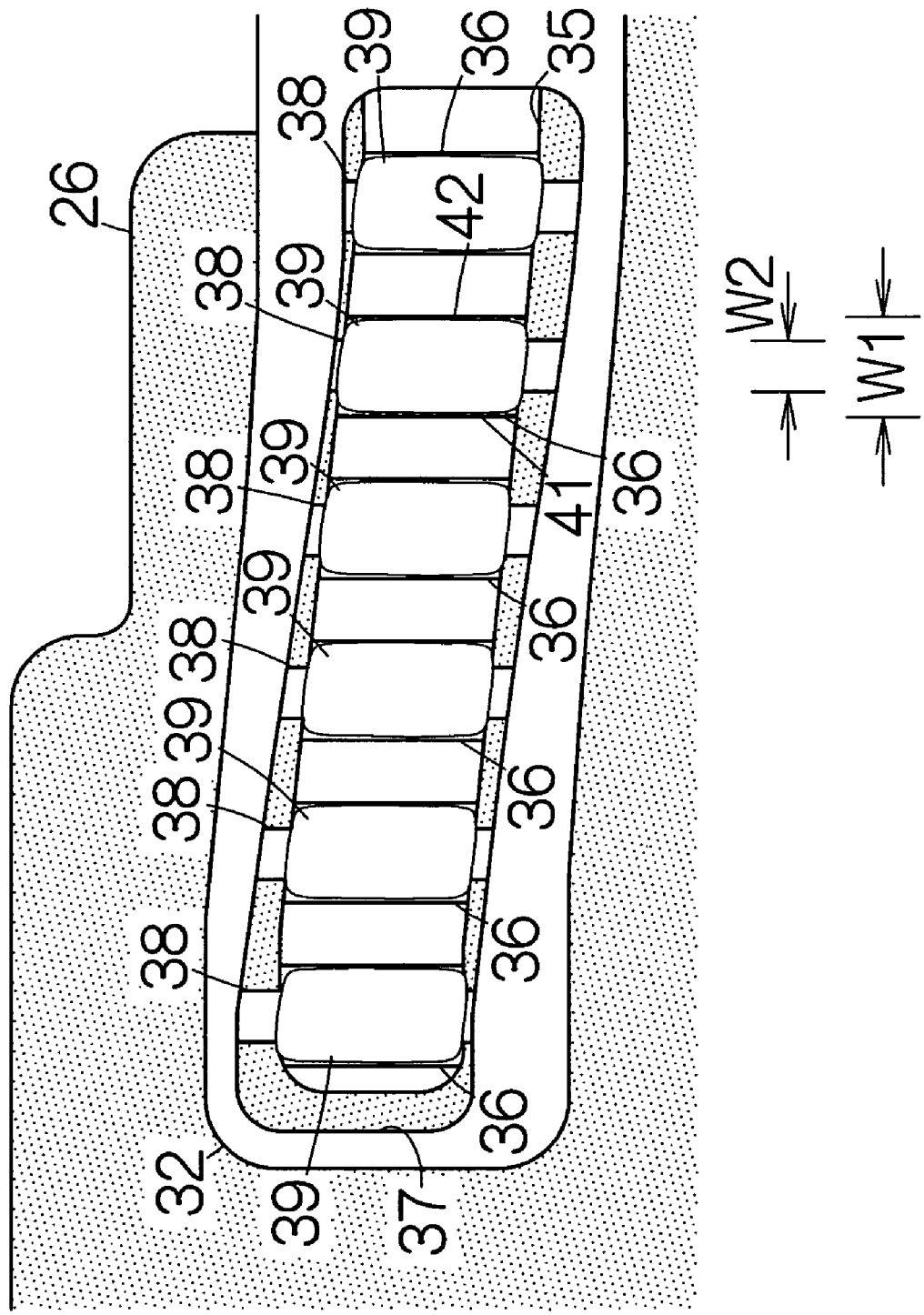
FIG. 3 is an enlarged partial plan view schematically illustrating the structure of first and second terminals.

The other end or rear end of the second flexible printed wiring board 32 is coupled to the first flexible printed wiring board 26 on the carriage block 16. As shown in FIG. 3, an opening 35 is defined in the protecting layer of the first flexible printed wiring board 26. First terminals 36, six of those, for example, are arranged in the opening 35 at predetermined intervals. Here, the first terminals 36 may extend side by side in the vertical direction perpendicular to the bottom plate of the enclosure body 12. The first terminals 36 are made of an electrically-conductive material such as copper. The first terminals 36 are connected to the wiring pattern on the first flexible printed wiring board 26.

An opening 37 is defined in the individual second flexible printed wiring board 32. Second terminals 38, six of those, for example, are arranged in the opening 37 at predetermined intervals. The second terminals 38 may extend side by side in the vertical direction perpendicular to the bottom plate of the enclosure body 12. The second terminals 38 are made of an electrically-conductive material such as copper. Gold and nickel layers may be plated on the surface of the copper, for example. The second terminals 38 are connected to the wiring pattern on the second flexible printed wiring board 32. The individual second terminal 38 thus establish a so-called flying lead.

The second terminals 38 are located on the corresponding first terminals 36. Solders 39 serve to bond the second terminals 38 to the corresponding first terminals 36. The solders 39 may be located between the first and second terminals 36, 38 and on the first terminals 36. The solders 39 allow an electrical connection between the first and second terminals 36, 38. This serves to enable establishment of an electrical connection between the flying head slider 22 and the small-sized circuit board 29. It should be noted that the first flexible printed wiring board 26, the first terminals 36, the second flexible printed wiring board 32, the second terminals 38 and the solders 39 in combination serve as a joint assembly of the present invention.

As is apparent from FIG. 3, the width W1 of the first terminal 36 is set larger than the width W2 of the second terminal 38. The solders 39 are contoured by first and second contours 41, 42 on the first terminals 36. The first and second contours 41, 42 are designed to extend along the edges of the first terminals 36. The first and second contours 41, 42 extend in parallel with each other. The individual second terminal 38 is located in a space between the first and second contours 41, 42.

Figure 4:
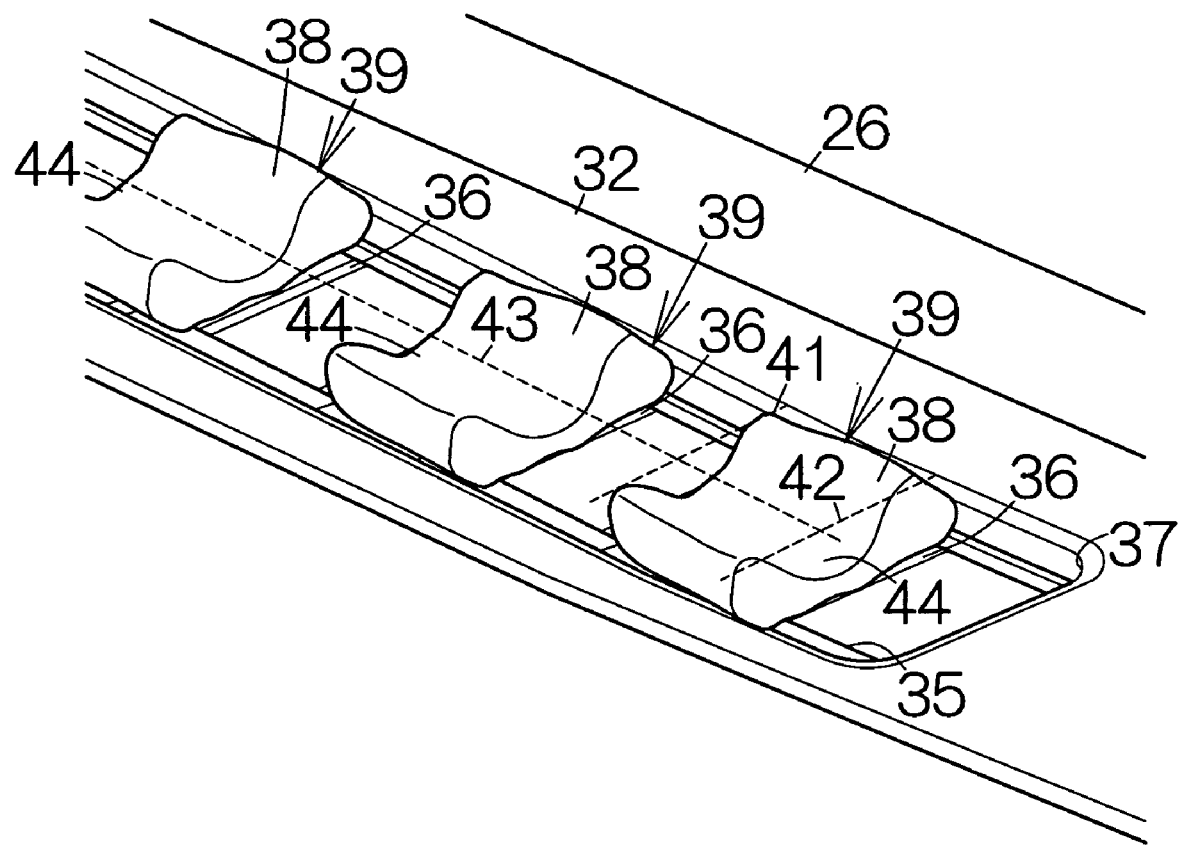
FIG. 4 is an enlarged partial perspective view schematically illustrating the shape of a solder.
Figure 5:
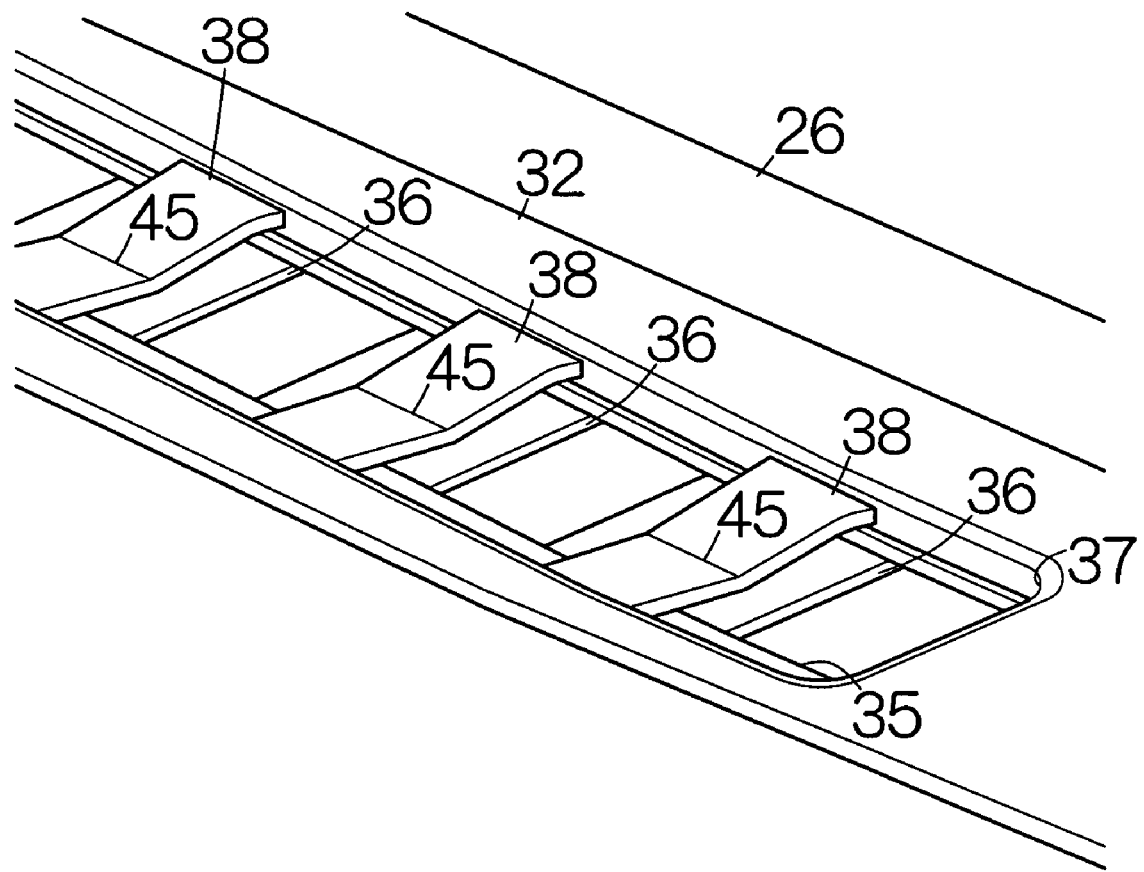
FIG. 5 is an enlarged partial perspective view schematically illustrating the shape of the second terminal.

As shown in FIG. 4, the individual solder 39 defines a notch 44. The notch 44 is designed to extend along an imaginary straight line 43 intersecting with pairs of the first and second contours 41, 42. The contact of a bonding tip results in establishment of the notch 44 as described later in detail. As shown in FIG. 5, the second terminals 38 bend at folds 45 extending in parallel with the imaginary straight line 43 so as to correspond to the shape of the corresponding notches 45.

Figure 6:
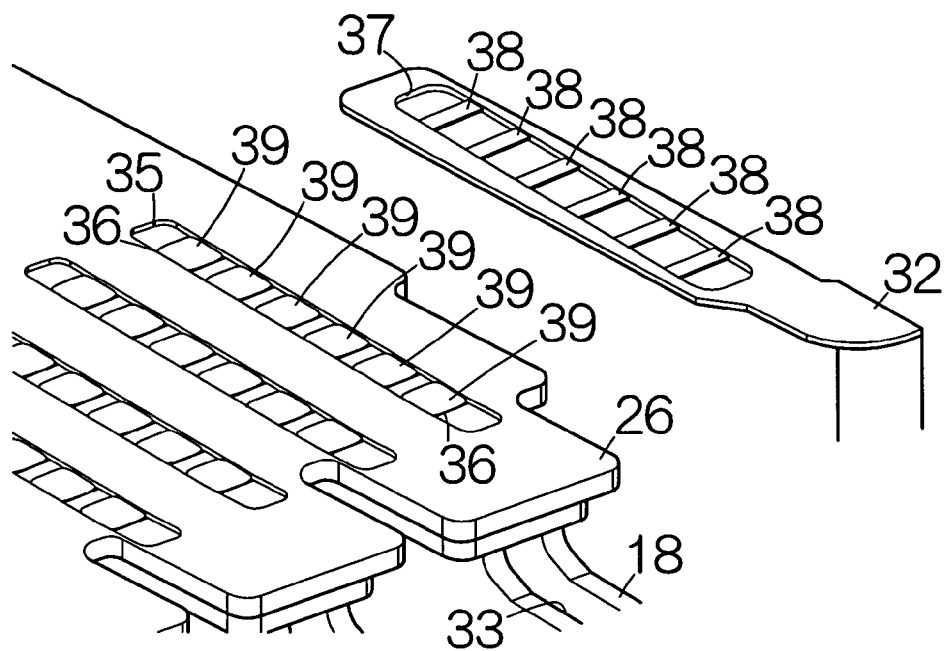
FIG. 6 is an enlarged partial perspective view schematically illustrating the solders located on the first terminals.

Next, a detailed description will be made on a method of bonding the second terminals 38 to the first terminals 36. As shown in FIG. 6, the solders 39 are previously put on the first terminals 36. Solder cream may be employed as the solders 39, for example. The melting point of the solders 39 is set in a range from 220 degrees Celsius to 240 degrees Celsius, for example. The solders 39 on the adjacent first terminals 36 are distanced from each other at a predetermined interval.

Figure 7:
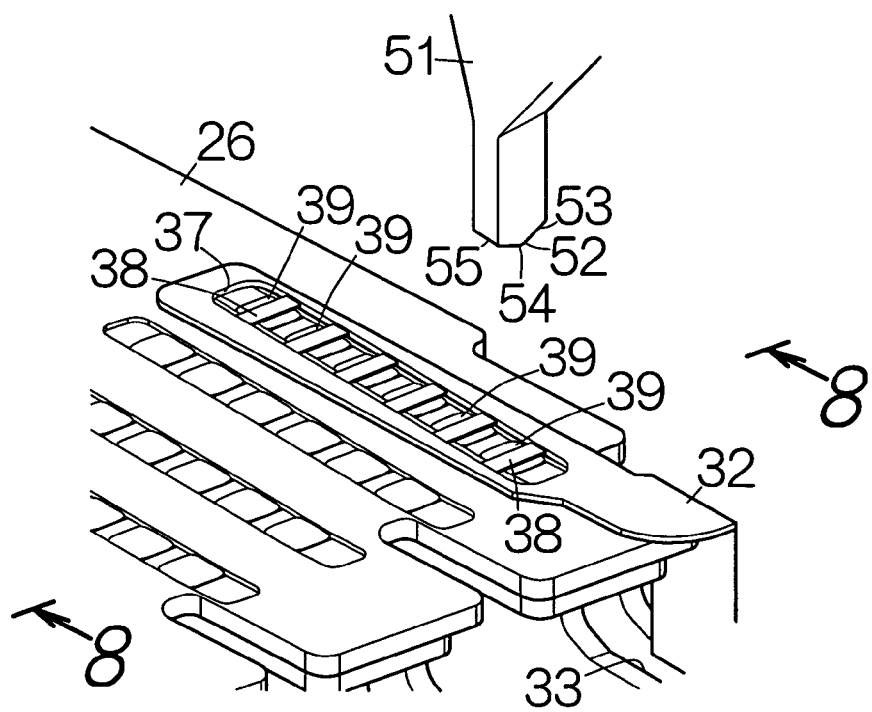
FIG. 7 is an enlarged partial perspective view of the second terminals positioned on the first terminals.

The head suspension assembly 19 is attached to the tip end of the individual carriage arm 18. When the second flexible printed wiring board 32 is received in the groove 33, the rear end of the second flexible printed wiring board 32 is located on the first flexible printed wiring board 26, as shown in FIG. 7. The second terminals 38 are positioned on the solders 39 on the corresponding first terminals 36. The tip end of a bonding tip 51 is thereafter urged against the surfaces of the second terminals 38, respectively.

Figure 8:
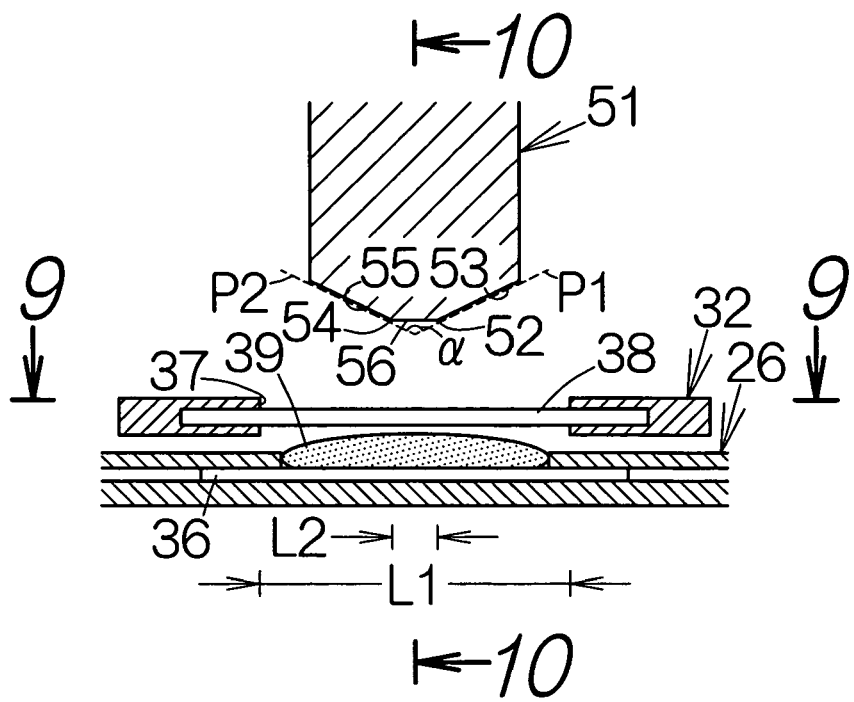
FIG. 8 is a sectional view taken along the line 8-8 in FIG. 7.

As shown in FIG. 8, the bonding tip 51 has a first edge 52 and a second edge 54 extending in parallel with the first edge 52. The tip end of the bonding tip 51 is thus defined between the first and second edges 52, 54. The tip end of the bonding tip 51 defines a flat contact surface 56. The flat contact surface 56 is designed to get first opposed to the first terminal 36. In addition, a first inclined surface 53 and a second inclined surface 55 are also defined on the bonding tip 51. The first inclined surface 53 gets remoter from the first terminal 36 at a position remoter from a first edge 52. The second inclined surface 55 gets remoter from the first terminal 36 at a position remoter from the second edge 54. The bonding tip 51 in this manner tapers. The first and second inclined surfaces 53, 55 may be a flat surface.

Figure 9:
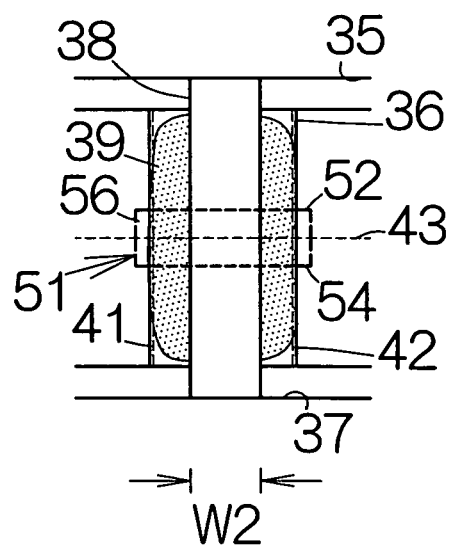
FIG. 9 is a sectional view taken along the line 9-9 in FIG. 8.

Here, a first imaginary plane P1 is defined to include the first inclined surface 53. A second imaginary plane P2 is likewise defined to include the second inclined surface 55. The first imaginary plane P1 intersects with the second imaginary plane P2 at an intersecting angle α. In this case, the intersecting angle α is an obtuse angle. The length L1 of the second terminals 38 located in the opening 37 is set at 0.6 mm approximately, for example. The length L2 of the contact surface 56 is set at 0.1 mm approximately, for example. The length L2 of the contact surface 56 is defined in the lengthwise direction of the second terminals 38. As shown in FIG. 9, the width W2 of the second terminals 38 may be set at 0.2 mm approximately. The interval is set at 0.7 mm approximately between the adjacent second terminals 38.

Figure 10:
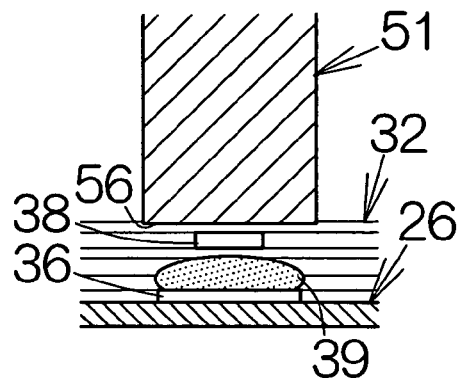
FIG. 10 is a sectional view taken along the line 10-10 in FIG. 8.

As is apparent from FIG. 9, the first and second edges 52, 54 intersect with the first and second contours 41, 42. The first and second edges 52, 54 may intersect with the first and second contours 41, 42 at right angles approximately. The contact surface 56 is designed to extend straight along the imaginary straight line 43 intersecting with the aforementioned first and second contours 41, 42. As shown in FIG. 10, the solder 39 of an appropriate amount may be applied to the individual first terminal 36.

The bonding tip 51 is heated to 400 degrees Celsius approximately, for example. The bonding tip 51 is applied to the second terminal 38 for urging the second terminal 38 against the solder 39 on the first terminal 36. Heat is transferred from the contact surface 56 to the second terminal 38. The heat of the second terminal 38 melts the solder 39. The urging force from the bonding tip 51 serves to bend the second terminal 38 toward the first terminal 36.

Figure 11:
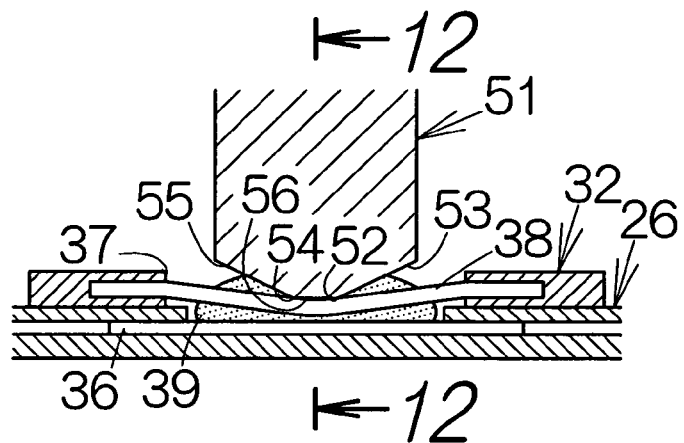
FIG. 11 is a sectional view, corresponding to FIG. 8, schematically illustrating the tip end of a bonding tip urged against the second terminal.
Figure 12:
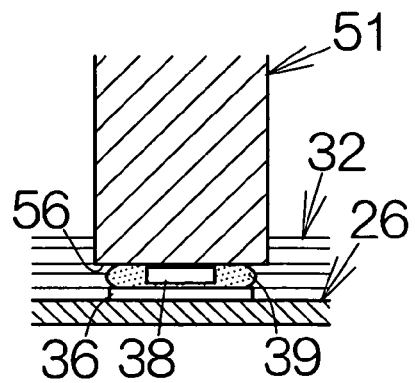
FIG. 12 is a sectional view, corresponding to FIG. 10, schematically illustrating the tip end of the bonding tip urged against the second terminal.

The second terminal 38 is located in a space between the first and second contours 41, 42 as described above. The first and second inclined surfaces 53, 55 get remoter from the first terminal 36 at a position remoter from the first and second edges 52, 54, respectively. The solder 39 is thus allowed to spread into gaps between the second terminal 38 and the first and second inclined surfaces 53, 55, as shown in FIG. 11. In this case, the solder 39 spreads over the second terminal 38 while the solder 39 is reliably prevented from spreading outside the first terminal 36. The first and second inclined surfaces 53, 55 come in contact with the solder 39 on the second terminal 38. The second terminal 38 is thus wrapped with the solder 39, as shown in FIG. 12.

Figure 13:
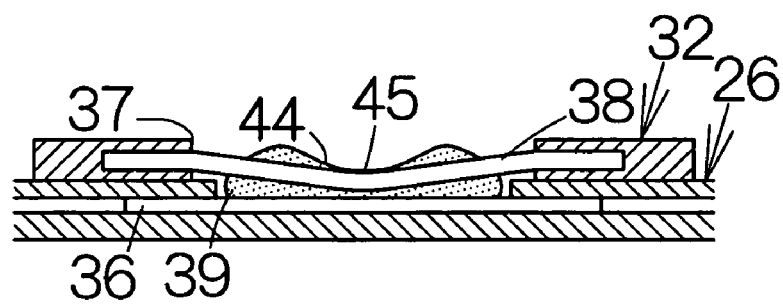
FIG. 13 is a sectional view, corresponding to FIG. 8, schematically illustrating the first and second terminals bonded to each other.

The application of heat to the bonding tip 51 is then terminated. The solder 39 is thus cooled down. This results in solidification of the solder 39. The bonging tip 51 is then taken away from the solder 39. As shown in FIG. 13, the solder 39 in this manner bonds the second terminal 38 to the corresponding first terminal 36. Since the tip end of the bonding tip 51 is urged against the solder 39, the aforementioned notch 44 is formed in the solder 39. Simultaneously, the second terminal 38 bends at the fold 45 in the aforementioned manner.

The contact surface 56 of the bonding tip 51 is defined between the first and second edges 52, 54 each intersecting with the first and second contours 41, 42. The solder 39 in a fluid state spreads into the gaps between the second terminal 38 and the first and second inclined surfaces 53, 55 of the bonding tip 51. The solder 39 is prevented from spreading outside the edges of the first terminal 36. This results in a reliable avoidance of a short circuit between the adjacent first terminals 36.

The first and second inclined surfaces 53, 55 are defined in the tip end of the bonding tip 51. The first and second imaginary planes P1, P2 intersect with each other at the intersecting angle α set at an obtuse angle. Such an intersecting angle α enables establishment of a larger volume around the contact surface 56 in the bonding tip 51 as compared with the case where the intersecting angle α is set at an acute angle. Heat is conducted to the contact surface 56 in the bonding tip 51 with a higher efficiency. The heat can be transferred from the contact surface 56 to the second terminal 38 with a higher efficiency. This results in a reduction in the working time of bonding.

A conventional second flexible printed wiring board includes four second terminals. The flying head slider 22 according to an embodiment of the present invention additionally includes the heater, not shown, for controlling the flying height of the flying head slider 22. The second flexible printed wiring board 32 according to the invention thus further includes additional two second terminals 38 for the heater. The first flexible printed wiring board is correspondingly designed to have additional first terminals 36. There is no change in the size of the second flexible printed wiring board 32. Accordingly, the width W2 of the second terminals 38 are reduced to two third the width of a second terminal in the conventional second flexible printed wiring board. The width W1 of the first terminal 36 are correspondingly reduced to two third the width of a first terminal in the conventional first flexible printed wiring board. Intervals are narrowed between the first terminals 36, 36 and between the second terminals 38, 38, respectively. Accordingly, the adjacent first terminals 36, 36 suffer from a higher probability of a short circuit. The amount of current is set different between the wiring patterns leading to the adjacent first and second terminals 36, 38. The short circuit thus causes supply of an excessive current to the electromagnetic transducer on the flying head slider 22, for example. This results in destruction of the electromagnetic transducer. The method according to the present invention is considerably effective to bond the second terminal 38 to the first terminal 36 in a reduced space.

Figure 14:
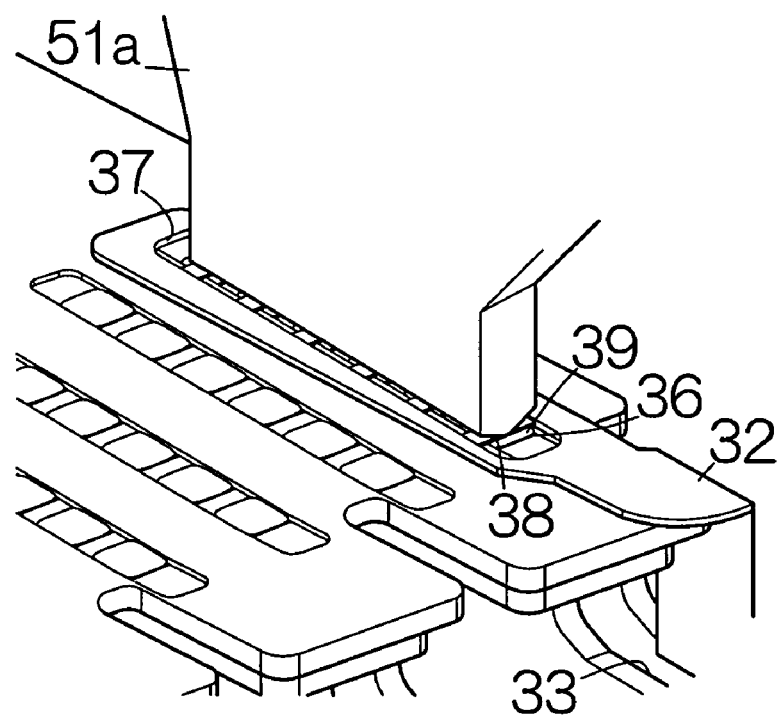
FIG. 14 is an enlarged partial perspective view schematically illustrating a boding tip according to another embodiment of the present invention.

Alternatively, a bonding tip 51a my be utilized to bond the second terminals 38 to the corresponding first terminals 36 in place of the aforementioned bonding tip 51, as shown in FIG. 14. In this case, the first and second edges 52, 54 of the bonding tip 51a intersect with two or more pairs of the first and second contours 41, 42. The bonding tip 51a enables a simultaneous bonding of two or more pairs of the first and second terminals 36, 38. This results in a reduction in the working time of bonding.

It should be noted that the first and second edges 52, 54 may extend on a common straight line. Specifically, the first and second inclined surfaces 53, 55 may directly intersect with each other. In other words, the contact surface 56 may be omitted between the first and second edges 53, 55.

What is claimed is:

1. A method of making a storage device, comprising:
    preparing a first flexible printed wiring board attached to a carriage having a tip end supporting a head suspension, said first flexible printed wiring board including a first terminal;
    preparing a second flexible printed wiring board extending from the head suspension toward the carriage, said second flexible printed wiring board including a second terminal; and
    using a tip end of a bonding tip for urging the first terminal onto a solder located on the second terminal, said solder contoured by first and second contours at least partially extending in parallel with each other, said first terminal at least partially located in a space between the first and second contours, wherein
    the tip end of the bonding tip is defined between a first inclined surface and a second inclined surface, the first inclined surface getting remoter from the second terminal at a position remoter from a first edge, the second inclined surface getting remoter from the second terminal at a position remoter from a second edge extending in parallel with the first edge, the first and second edges intersecting with the first and second contours.

2. The method according to claim 1, wherein a first imaginary plane including the first inclined surface intersects with a second imaginary plane including the second inclined surface at an obtuse angle.

3. The method according to claim 1, wherein the first and second edges of the bonding tip intersect with two or more pairs of the first and second contours.

4. The method according to claim 1, wherein the second terminal establishes a flying lead.

\* \* \* \* \*